United States Patent [19]

Ravindhran et al.

[11] Patent Number: 4,683,641
[45] Date of Patent: Aug. 4, 1987

[54] METHOD OF CODING A MOS ROM ARRAY

[75] Inventors: Kothandaraman S. Ravindhran; Narayan M. Kulkarni, both of Mesa, Ariz.

[73] Assignee: GTE Communication Systems Corp., Phoenix, Ariz.

[21] Appl. No.: 851,292

[22] Filed: Apr. 8, 1986

Related U.S. Application Data

[63] Continuation-in-part of Ser. No. 519,299, Aug. 1, 1983, abandoned.

[51] Int. Cl.⁴ ............................................. H01L 21/425
[52] U.S. Cl. ..................................................... 437/41
[58] Field of Search ................... 148/1.5, 187; 29/571, 29/576 B, 577 R

[56] References Cited

U.S. PATENT DOCUMENTS

| | | | |
|---|---|---|---|
| 4,096,522 | 6/1978 | Suzuki et al. ...................... | 357/41 X |
| 4,406,049 | 9/1983 | Tam et al. ........................... | 29/571 |
| 4,455,742 | 6/1984 | Williams et al. ................. | 148/1.5 X |
| 4,486,943 | 12/1984 | Ryden et al. ..................... | 148/1.5 X |
| 4,495,693 | 1/1985 | Iwahashi et al. ..................... | 29/571 |
| 4,536,944 | 8/1985 | Bracco et al. ......................... | 29/571 |

Primary Examiner—George T. Ozaki
Attorney, Agent, or Firm—John A. Odozynski

[57] ABSTRACT

A method of coding a ROM from a partially processed semiconductor wafer comprising a substrate, a plurality of spaced regions separated by regions of isolating oxide deposited in said substrate, a layer of gate oxide overlying each of said spaced regions and a gate electrode overlying each layer of said gate oxide, is described comprising the use of photoresist material for preventing the formation of source and drain regions under selected ones of said gate electrodes during a subsequent doping step. The photoresist material restricts the area of implantation of dopant used for forming source and drain regions in the ROM device.

11 Claims, 2 Drawing Figures

5

METHOD OF CODING A MOS ROM ARRAY

CROSS REFERENCE TO A RELATED APPLICATION

This application is a continuation-in-part of Applicants' copending application, Ser. No. 519,299, filed Aug. 1, 1983, now abandoned.

The present invention relates to the fabrication of semiconductor memory devices in general, and in particular to a method of coding a CMOS ROM memory device at a late stage in the ROM fabrication process.

BACKGROUND OF THE INVENTION

A ROM is a read-only memory widely used in the computer industry and particularly in video games. In general, at some step in the fabrication of the ROM, the ROM is tailored to a specific application, such as memory for a video game program, by coding. Coding involves disabling selected transistors in a memory array or preventing their formation during the fabrication of the array.

In the process of MOSFET ROM coding, one conventional approach has been to raise the threshold voltage of selected transisstors to render them non-functional at normal operating voltages. Typically, this was achieved by implanting species (boron for N-channel devices and phosphorus for P-channel devices) beneath the gate electrode so that the inversion of the channel necessary for current conduction occurred at a higher than normal gate operating voltage.

A second conventional approach has been to increase the oxide thickness under the gate electrode such that the threshold voltage of the device is raised due to a corresponding decrease in the gate oxide capacitance.

Both of the above approaches have been successfully practiced in the industry; however, with the demand for ROM devices increasing and with integrated circuits approaching smaller and smaller geometries, several drawbacks to the conventional approaches have arisen with ever-increasing adverse consequences.

The first approach of implanting a specie of dopant under the gate electrode requires a separate masking step and adds to the number of processing steps required. Further, with a fixed voltage approach for scaled-down geometries, the implant doses get larger and larger to achieve the same threshold value for the nonfunctional transistor. Also, while high energy implantation can be used at a relatively late stage of the fabrication in many types of devices, it requires costly equipment and is very sensitive to process variation.

The implanting approach can also be used to code CMOS devices using a separate masking step; however, a high energy implant dose is required and therefore, for the reasons stated above, the technique is not cost effective. Moreover, when used for coding CMOS devices, the technique must be done early in the fabrication process.

The coding approach using an increased oxide thickness under the gate electrode has its limitations also. The oxide thickness is the same as the field oxide thickness often used as an isolation between active devices. The resulting field threshold voltage being above the normal operating gate voltage of the device provides a high potential barrier preventing the operation of the non-functional transistor. However, as with the use of the implantation technique in CMOS devices, the use of isolation type oxides under the gate of a selected transistor to render the transistor non-functional with normal operating voltages must be done at an early stage of the device fabrication. Indeed, as a practical matter, the use of a gate disabling oxide must be done at the very beginning stage of the device fabrication.

Unless the coding of a ROM can be achieved at a late stage of the device fabrication, the maintenance of large inventories of substantially completed ROM devices is not possible and, as a consequence, undesirable long delivery times are required.

SUMMARY OF THE INVENTION

For the foregoing reasons, a principal object of the present invention is a method of coding a ROM which can be done at a late stage in the device fabrication.

Another object of the present invention is a method as described above which comprises steps for preventing the formation of a source and/or drain region under the gate of a selected transistor in a ROM memory array to render the transistor nonfunctional with normal operating voltages.

Another object of the present invention is a method as described above for coding a CMOS ROM memory device.

In accordance with the above objects, there is provided a method of preventing the formation of a source and/or drain region under the gate of a selected transistor in a CMOS ROM memory array which is made using conventional complementary insulated gate metal oxide on silicon (CMOS IGFET) processing techniques without adding any additional masking steps. Moreover, the coding of the array can be accomplished at the latest possible step in the fabrication of the device wafer. This enables the manufacturer of the devices to maintain a large inventory of uncoded wafers and thus shorten the time it takes to deliver coded wafers to a customer once the coding instructions are received.

BRIEF DESCRIPTION OF THE DRAWING

The above and other objects, features and advantages of the present invention will become apparent from the detailed description of the accompanying drawing in which.

DETAILED DESCRIPTION OF THE PREFERRED EMBODIMENT

Figure 1:
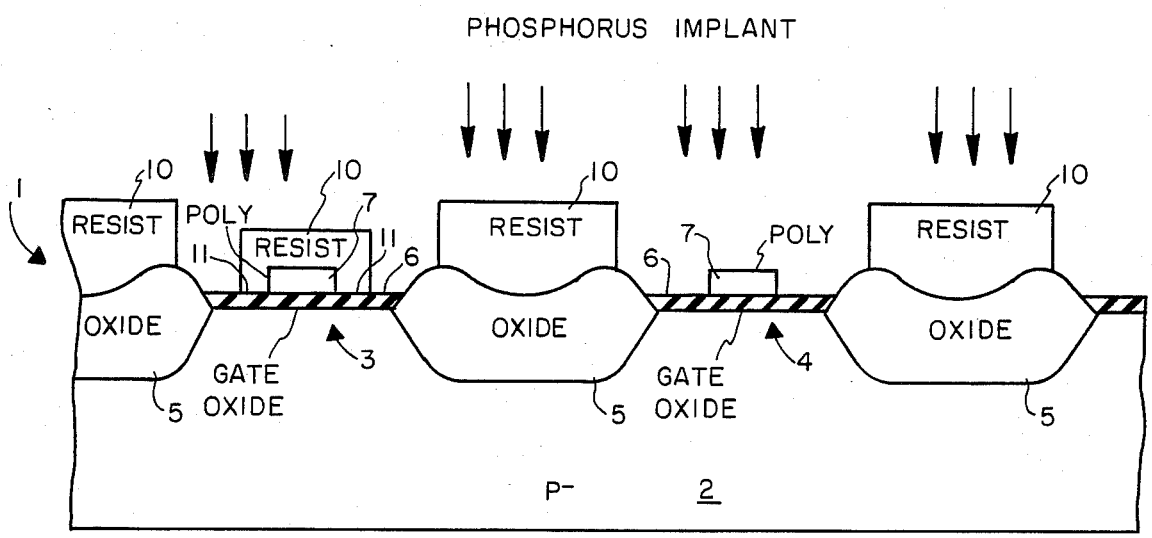
FIG. 1 is a partial cross-sectional view of a MOSFET wafer being fabricated according to the present invention.

Referring to FIG. 1, there is shown a partial cross-sectional view of a MOSFET wafer 1 being fabricated according to the present invention. In the wafer 1 there is provided a substrate 2, a plurality of spaced regions 3 and 4, separated by regions 5 of isolating oxide deposited in the substrate 2. Overlaying each of the spaced regions 3 and 4, there is provided a layer of gate oxide 6. Overlaying each of the layers of gate oxide 6, there is provided a gate electrode 7. Typically the gate electrode 7 comprises polysilicon.

As thus far described, the wafer 1 is fabricated using conventional insulated gate metal oxide on silicon processing techniques with each of the regions 3 and 4 comprising a potential active transistor region. To make an active transistor region, there must be further provided in a subsequent processing step a source and drain region which extends beneath the gate 7. However, in accordance with the present invention, selected ones of the regions 3 and 4 are nonfunctional under normal operating voltages.

Thus, in accordance with the present invention, a protective layer of material 10 is deposited on a predetermined area of the exposed surface of each of said regions 5 of isolating oxide, the exposed surface of selected ones of said gate electrodes 7, such as, for example, the gate electrode in the region 3, and a predetermined area 11 of the exposed surface of said gate oxide layer 6 adjacent to said selected one of said gate electrodes 7. The type of material used in the protective layer must be compatible with the underlaying surfaces and have physical characteristics for preventing the doping of the underlying surfaces during a subsequent doping stage. Typically, the protective layer may comprise conventional photoresist material.

The spacing between the gate electrode and the active region is not critical. However, it is important that the width of area 11, that is, the degree of overlap of the protective material around the complete perimeter of the gate electrode be at least one micron.

After the protective layer 10 is deposited, the wafer 1 is doped with a selected specie of dopant, as by boron or phosphorus implantation. For example, in the fabrication of N channel devices, phosphorus is typically implanted. In the fabrication of P channel devices, boron is typically implanted.

The implantation dosage can vary from between $5 \times 10^{15}$ atoms/cm$^2$ and $1 \times 10^{16}$ atoms/cm$^2$, as the characteristic geometry of the device varies from 5 micron to 3 micron. Similarly, the implantation energy can vary from 35 Kev to 80 Kev, again depending on device geometry.

Figure 2:
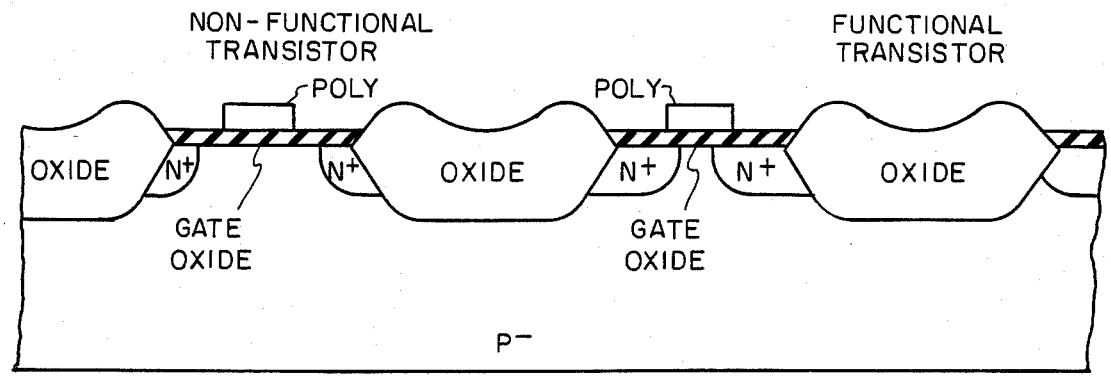
FIG. 2 is a partial cross-sectional view of a MOSFET wafer made according to the present invention.

In addition, with respect to both the functional and nonfunctional transistors shown in FIG. 2, the width of the gate electrodes is approximately 3 microns and the distance from the edges of the gates to the edges of the nearest of the isolating field oxides is approximately 3 microns. After diffusion and depletion due to contact potential, the N+ "source" and "drain" regions for nonfunctional transistors extend to within approximately 0.8 micron of the edges of the gate electrodes. (It is important that this dimension be maintained greater than 0.2 micron.)

For functional transistors, the N+ drain and source regions extend a distance that results in an overlap, between the edges of the gate electrode and the respective drain or source region, of approximately 0.2 micron. The depth of the drain and source regions is approximately 1.2 micron.

It should be noted that the information provided above is illustrative of but one of the myriad process situations and device designs in conjunction with which the subject invention may be used. However, specific decisions regarding device geometries and dimensions will depend on the characteristics of the particular process used to fabricate the devices and the performance desired of those devices.

Referring to FIG. 2, after the exposed surfaces of the wafer 1 in the areas between the protective layer 10 are implanted with the selected dopant, the protective layer 10 is removed from the surfaces of wafer 1 covered thereby. After the protective layer 10 is removed from the wafer 1, the doped regions are diffused for forming a source and drain region under the gates of the nonselected transistor regions, for example, region 4.

Diffusion is done in a nitrogen atmosphere at a temperature between 830 and 1000 degrees Centigrade and persists until source and drain junction depths between 0.5 and 1.0 micron are obtained. Due to the restricted implantation of the region 3, however, the diffusion of the potential source and drain regions in the region 3 do not extend under the gate 7 in region 3, thus rendering the potential transistor in the region nonfunctional, i.e., it will not turn on under normal operating voltages.

While it would have been possible to cover the entire oxide layer of region 3 with photoresist material, the area of the oxide layer 6 covered by photoresist material was restricted to permit the implantation of the selected dopant in the vicinity of the facing surfaces of the isolation oxide regions 5. The reasons for this is that in many MOSFET ROM memory devices, source and drain regions of adjacent transistors are integral and required for operation of the device.

While a preferred embodiment of the invention is disclosed and described, it is contemplated that change may be made thereto without departing from the spirit and scope of the present invention. For example, the same procedures for rendering an N-channel device nonfunctional may also be used for rendering a P-channel device nonfunctional. Similarly, the same procedures can be used for rendering both N and P-channel type devices nonfunctional in complementary (CMOS) devices. For these reasons, it is intended that the above description be considered only as illustrative of the invention and that the scope of the invention be determined solely by reference to the claims hereafter provided in their equivalents.

What is claimed is:

1. A method of producing a ROM from a partially processed semiconductor wafer comprising a substrate, a plurality of spaced regions separated by regions of isolating oxide grown in said substrate, a layer of gate oxide overlaying each of said spaced regions and a gate electrode overlaying each layer of said gate oxide, comprising the steps of:

depositing a protective layer of material on a predetermined area of the exposed surface of each of said regions of isolating oxide, the exposed surface of selected ones of said gate electrodes and a predetermined area of the exposed surface of said gate oxide layer adjacent to said selected ones of said gate electrodes for preventing the doping of the surface underlaying said protective layer during a subsequent doping step;

doping the exposed surface of said wafer in the areas between said protective layer;

removing said protective layer of material from the surfaces covered thereby; and diffusing said doped areas for forming source and drain regions under nonselected ones of said gate electrodes.

2. A method according to claim 1 wherein said step of depositing comprises the step of spinning on a layer of photoresist material.

3. A method according to claim 1 wherein said substrate is of a first conductivity type and said step of doping comprises the step of doping with a material of a second conductivity type.

4. A method according to claim 3 wherein said first conductivity type is a P type conductivity and said second conductivity type is an N type conductivity.

5. A method according to claim 1 where said step of depositing said protective layer over a predetermined area of the exposed surface of said gate oxide layer adjacent to said selected ones of said gate electrodes comprises the step of leaving exposed a predetermined area of said gate oxide layer adjacent to the isolating oxide regions on opposite sides of said selected ones of said gate electrodes and said step of doping comprises the step of doping said exposed predetermined areas of gate oxide.

6. A method according to claim 5 wherein said substrate is of a first conductivity type and said step of doping comprises the step of doping with a material of a second conductivity type.

7. A method according to claim 6 wherein said first conductivity type is a P type conductivity and said second conductivity type is an N type conductivity.

8. A method of coding, in a single masking operation, a MOS ROM array that comprises a plurality of inchoate transistor regions, each of which inchoate transistor regions comprises both a gate oxide region residing on a substrate of a first conductivity type and a gate electrode residing over a portion of the respective gate oxide region, and wherein individual inchoate transistor regions are separated by isolating oxide regions, the method comprising the steps of:

masking a photoresist material atop the array so that the resist resides atop the isolating oxide regions, overlaps selected ones of the gate electrodes of inchoate transistor regions, and is absent from non-selected ones of the said gate electrodes;

implanting, with an impurity of a conductivity type different from the first conductivity type, areas of the array not covered by the photoresist; and diffusing the implanted impurity so that diffused regions extend under the nonselected gate electrodes, thereby facilitating the formation of functional transistors, but do not extend under the selected gate electrodes, thereby inhibiting the formation of functional transistors, 9. A method of coding a MOS ROM array as defined in claim 8 wherein the photoresist material overlaps the selected gate electrodes by a predetermined distance that permits implantation of limited areas of the substrate contiguous to the isolating oxide regions and that substantially inhibits implantation within the predetermined distance from the perimeters of the selected gate electrodes.

10. A method of coding a MOS ROM array as defined in claim 9 wherein the substrate is of P-type conductivity and the impurity is of N-type conductivity.

11. A method of coding a MOS ROM array that comprises a plurality of inchoate transistor regions residing on a semiconductor substrate and wherein each of the inchoate transistor regions comprises both a gate oxide region residing on the substrate and a gate electrode residing over a portion of the gate oxide region and wherein the inchoate transistor regions are separated by isolating oxide regions, the method comprising the steps of:

(a) depositing a photoresist material over the ROM array so that the photoresist material covers a substantial portion of each of the isolating oxide regions, covers the gate electrodes of selected transistor regions and limited predetermined areas of the gate oxide regions subjacent the gate electrodes of the selected transistor regions, and is absent from the gate electrodes and gate oxide regions of nonselected transistors;

(b) implanting areas with an impurity array not covered by the photoresist material; and (c) diffusing, such as by application of heat to the array, the implanted impurity so as to form (i) in nonselected transistors, impurity regions that extend from the isolating oxide regions to areas somewhat underneath the respective gate electrodes, and (ii) in selected transistors, impurity regions contiguous to the isolating oxide regions but extending a distance sufficiently short of the respective gate electrodes so as to inhibit the formation of functional transistors.

* * * * *